United States Patent [19]
Lee

[11] Patent Number: 6,162,690
[45] Date of Patent: Dec. 19, 2000

[54] METHODS OF FORMING FIELD EFFECT TRANSISTORS HAVING SELF-ALIGNED INTERMEDIATE SOURCE AND DRAIN CONTACTS

[75] Inventor: Kang-Yoon Lee, Kyunggi-do, Rep. of Korea

[73] Assignee: Samsung Electronics Co., Ltd., Rep. of Korea

[21] Appl. No.: 09/160,602

[22] Filed: Sep. 25, 1998

[30] Foreign Application Priority Data

Oct. 1, 1997 [KR] Rep. of Korea ............ 97-50831

[51] Int. Cl.$^7$ ............................................. H01L 21/336
[52] U.S. Cl. .................... 438/300; 438/558; 438/564; 438/697
[58] Field of Search ............................ 438/300, 299, 438/149, 584, 596, 595, 684, 558, 564, 626, 631, 645, 697, 542

[56] References Cited

U.S. PATENT DOCUMENTS

| | | | |
|---|---|---|---|
| 5,312,768 | 5/1994 | Gonzalez | 438/227 |
| 5,409,853 | 4/1995 | Yu | 437/41 |
| 5,462,888 | 10/1995 | Chiu et al. | 438/669 |
| 5,637,518 | 6/1997 | Prall et al. | 438/301 |
| 5,668,027 | 9/1997 | Hashimoto et al. | 438/305 |
| 5,827,768 | 10/1998 | Lin et al. | 438/300 |
| 5,879,976 | 3/1999 | Fujiwara | 438/163 |
| 5,970,352 | 10/1999 | Shiozawa et al. | 438/300 |

OTHER PUBLICATIONS

Wolf, S.; Silicon Processing for the VLSI Era vol. 2: Process Integration, Sunset Beach, CA, 1990, p. 65.

Togo et al., "*Novel Deep Sub–Quarter Micron PMOSFETs with Ultra–Shallow Junctions Utilizing Boron Diffusion from Poly–Si/Oxide (BDSOX)*", IEEE, 1994 Symposium on VLSI Technology Digest of Technical Papers, pp. 21–22.

Primary Examiner—John F. Niebling
Assistant Examiner—Christopher Lattin
Attorney, Agent, or Firm—Myers Bigel Sibley & Sajovec

[57] ABSTRACT

Methods of forming field effect transistors include the steps of forming an insulated gate electrode on a face of a substrate containing a semiconductor region therein extending to the face. A conductive layer of first conductivity type is also formed on the face and on a sidewall and upper surface of the insulated gate electrode. Dopants of first conductivity type are then diffused from the conductive layer into the semiconductor region to define source and drain regions of first conductivity type therein which are self-aligned to the insulated gate electrode. A step is also performed to remove a portion of the conductive layer to thereby define an intermediate source/drain contact (which is also self-aligned to the insulated gate electrode) and expose the upper surface of the insulated gate electrode. An electrode is then formed in contact with the intermediate source/drain contact.

17 Claims, 3 Drawing Sheets

METHODS OF FORMING FIELD EFFECT TRANSISTORS HAVING SELF-ALIGNED INTERMEDIATE SOURCE AND DRAIN CONTACTS

FIELD OF THE INVENTION

The present invention relates to methods of forming semiconductor devices for integrated circuits and devices formed thereby.

BACKGROUND OF THE INVENTION

Attempts to increase the degree of integration of semiconductor devices on integrated circuit substrates have necessarily required a corresponding decrease in minimum dimensions and design rule tolerances. For example, with respect to field effect transistors, dimensions relating to lateral contact area, gate lengths and spacing have typically been reduced in order to achieve higher integration densities. However, because reductions in gate length and spacing may result in increased short channel effects and electrical shorting between contacts and active regions of a transistor, steps have been taken to prohibit these adverse consequences of device scaling. For example, to inhibit short-channel effects, shallow source/drain junctions have been used, as described in an article by M. Togo et al., entitled "Novel Deep Sub-Quarter Micron PMosfets With Ultra-Shallow Junctions Utilizing Boron Diffusion from Poly-Si/Oxide (BDSOX)", IEEE Symposium on VLSI Tech. Digest, pp. 21–22 (1994).

Unfortunately, such attempts may not adequately address the parasitics associated with increased contact resistance when misalignment of contacts becomes significant relative to the lateral dimensions of the transistor. For example, as illustrated by FIG. 1, misalignment between a conductive contact plug 20 and a source region 14 of a field effect transistor may cause the contact area between these two regions to be reduced significantly (as illustrated by region 21) and such reductions typically result in increases in parasitic contact resistance. Here, the transistor of FIG. 1 includes a substrate 10, source and drain regions 14 and an insulated gate electrode comprising a gate 12a, gate capping layer 12b and sidewall spacers 16. An electrically insulating interlayer 18 is also provided. Contact plugs are provided in contact holes formed within the interlayer 18.

Thus, notwithstanding attempts to provide field effect transistors having excellent electrical characteristics at reduced lateral dimensions, there continues to be a need for improved methods of forming field effect transistors and transistor formed thereby.

SUMMARY OF THE INVENTION

It is therefore an object of the present invention to provide improved methods of forming semiconductor devices for integrated circuits and devices formed thereby.

It is another object of the present invention to provide methods of forming field effect transistors having improved source/drain contacts and transistors formed thereby.

It is still another object of the present invention to provide methods of forming field effect transistors having electrical characteristics which are less susceptible to degradation caused by process margin variations and transistors formed thereby.

These and other objects, advantages and features of the present invention are provided by methods of forming field effect transistors which include the steps of forming an insulated gate electrode on a face of a substrate containing a semiconductor region therein extending to the face. A conductive layer of first conductivity type is also formed on the face and on a sidewall and upper surface of the insulated gate electrode. Dopants of first conductivity type are then diffused from the conductive layer into the semiconductor region to define source and drain regions of first conductivity type therein which are self-aligned to the insulated gate electrode. A step is also performed to remove a portion of the conductive layer to thereby define relatively large area intermediate source/drain contacts (which are also self-aligned to the insulated gate electrode) and expose the upper surface of the insulated gate electrode. An electrode is then formed in contact with an intermediate source/drain contact.

According to a preferred embodiment of the present invention, the removing step is preceded by the step of forming a first interlayer insulating layer on the conductive layer. The removing step is then performed by planarizing the first interlayer insulating layer and the conductive layer simultaneously to expose the upper surface of the insulated gate electrode. This planarization step may be performed by chemically-mechanically polishing and/or chemically etching the first interlayer insulating layer and the conductive layer. The step of forming a conductive layer may comprise the steps of depositing a polycrystalline silicon layer on the face and on a sidewall and upper surface of the insulated gate electrode and then implanting dopants of first conductivity type into the deposited polycrystalline silicon layer. A step may also be performed to further etch the conductive layer using the planarized first interlayer insulating layer as an etching mask, so that conductive residues can be completely removed from the upper surface of the insulated gate electrode. The step of forming an insulated gate electrode may comprise the steps of forming a gate oxide insulating layer on the face, forming a gate conductive layer on the gate oxide insulating layer, forming a gate capping layer on the gate conductive layer and then patterning these layers to define a gate electrode having exposed sidewalls. Gate insulating spacers are then formed on the exposed sidewalls to complete the formation of the insulated gate electrode. Steps may also be performed to form a second interlayer insulating layer on the planarized first interlayer insulating layer and then selectively etch the second interlayer insulating layer to define a contact hole therein which exposes the intermediate source/drain contact.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The terms "first conductivity type" and "second conductivity type" refer to opposite conductivity types and each embodiment disclosed herein includes its complementary embodiment as well. It will also be understood that when a layer is referred to as being "on" another layer or substrate, it can be directly on the other layer or substrate, or intervening layers may also be present.

Figure 1:
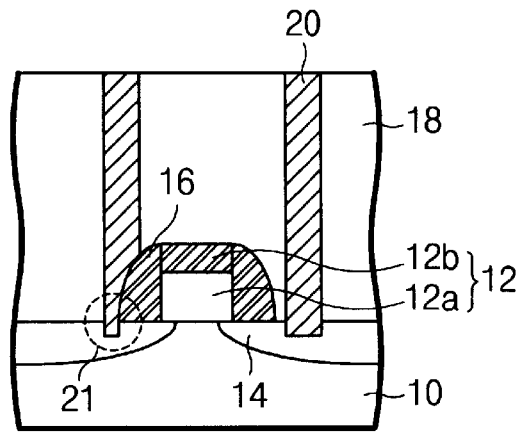
FIG. 1 is a cross-sectional view of a metal-oxide-semiconductor (MOS) field effect transistor according to the prior art.
Figure 2:
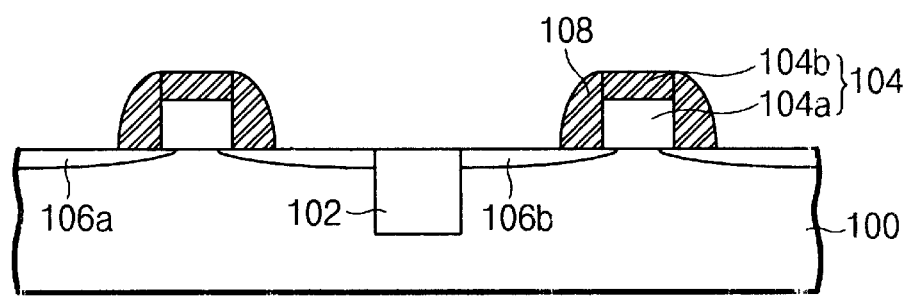
FIGS. 2–5 and 7 are cross-sectional views of intermediate structures which illustrate methods of forming field effect transistors according to a first embodiment of the present invention.

Referring now to FIGS. 2–7, preferred methods of forming field effect transistors (e.g., NMOS, PMOS, CMOS) according to the present invention will be described. In particular, FIG. 2 illustrates a semiconductor substrate 100 (e.g., P-type) having a trench isolation region 102 therein comprising an electrically insulating material such as silicon dioxide. The trench isolation region 102 extends to a face of the substrate 100 and provides electrical isolation between adjacent active regions within the substrate 100. Ion implanted regions may also be used to provide electrical isolation. A threshold-adjust implant step may also be performed so that subsequently formed transistors have desired threshold voltages. A plurality of insulated gate electrodes are also formed on the face. These gate electrodes extend opposite respective active regions in the substrate 100, as illustrated. Each gate electrode may be formed by initially forming a gate oxide insulating layer (not shown) in contact with the face and then forming a gate conductive layer (e.g., doped or undoped polysilicon layer) on the gate oxide insulating layer. These steps may then be followed by the steps of forming a gate capping layer (e.g., silicon nitride layer) on the gate conductive layer. These layers are then patterned using conventional photolithographically defined etching steps to define a plurality of gate electrodes 104. As illustrated, each gate electrode 104 comprises an insulating cap 104b and a conductive region 104a. The formation of lightly doped source and drain regions (LDD) 106a and 106b may then be initiated by implanting dopants of first conductivity type (e.g., N-type) into the face of the substrate 100 at a low dose level, using the gate electrodes 104 as an implant mask. Here, the dopants may comprise phosphorus or arsenic, for example, and the implant dose energy may be set to 30 KeV. Gate insulating spacers 108 may then be formed on the exposed sidewalls of the gate electrodes 104 by depositing a layer of an electrically insulating material and then performing an etch-back step to define the spacers and expose the face. Here, the electrically insulating material may comprise silicon nitride and may have a thickness in a range between about 500 Å and 1000 Å.

Figure 3:
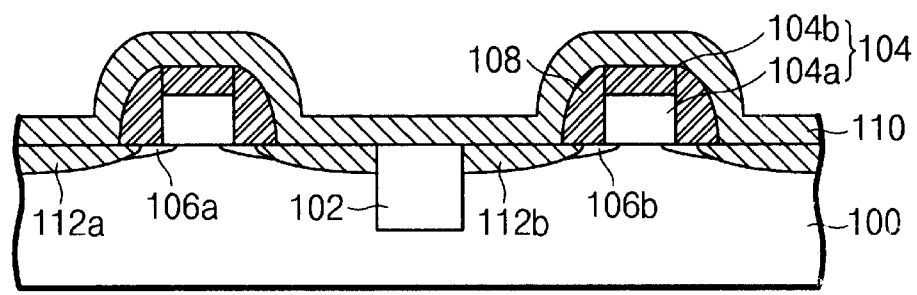
Figure 4:
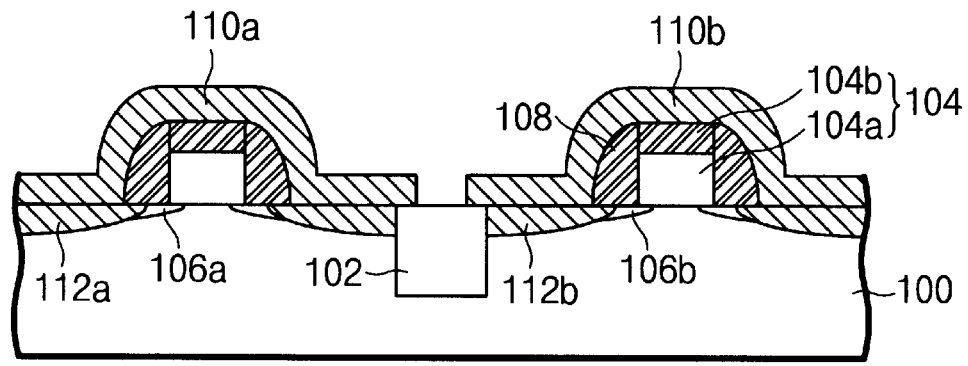

Referring now to FIG. 3, after a native oxide layer is removed, a conductive layer 110 may be formed on the face and on a sidewall and upper surface of the insulated gate electrode. The conductive layer may comprise an in-situ doped polycrystalline silicon layer or an undoped polycrystalline silicon layer which is subsequently doped by performing a blanket implant of first conductivity type dopants. The conductive layer may have a thickness in a range between about 500 Å and 1000 Å. An annealing step may then be performed to drive first conductivity type dopants from the conductive layer 110 into the LDD regions and define relatively shallow source and drain regions 112a and 112b. These source and drain regions 112a and 112b may be formed to have a dopant concentration therein in a range between about $1 \times 10^{19}$ cm$^{-3}$ and $1 \times 10^{21}$ cm$^3$. The formation of these shallow source and drain regions may inhibit short channel effects. Referring now to FIG. 4, a photolithographically defined etching step may then be performed to define separate conductive regions 110a and 110b which are electrically isolated from each other, as illustrated.

Figure 5:
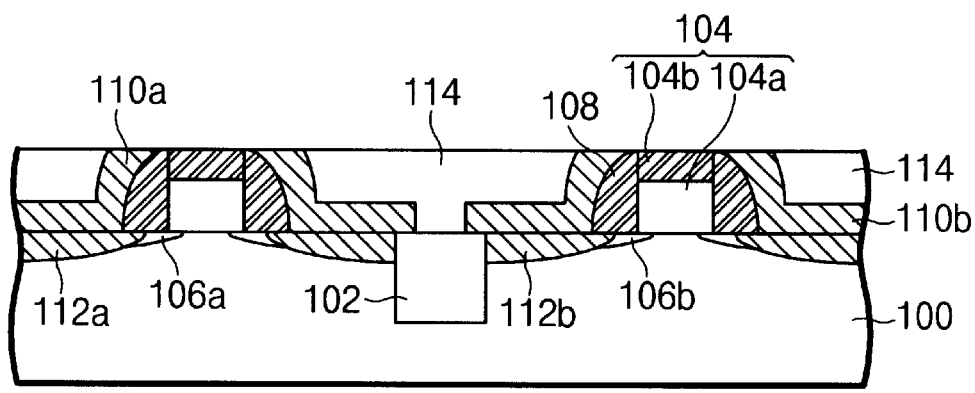

Referring now to FIG. 5, a blanket first interlayer insulating layer 114 (e.g., silicon dioxide layer) may then be formed on the structure of FIG. 4. A planarization step using such techniques as chemical-mechanical polishing, is then performed to planarize the first interlayer insulating layer 114 and planarize the separate conductive regions 110a and 110b so that each conductive region can perform the function of an intermediate source/drain contact of first conductivity type. During this step, the upper surfaces of the insulated gate electrodes are exposed. In particular, the insulating cap 104b may be used as a planarization/etch stop, as will be understood by those skilled in the art.

Figure 6:
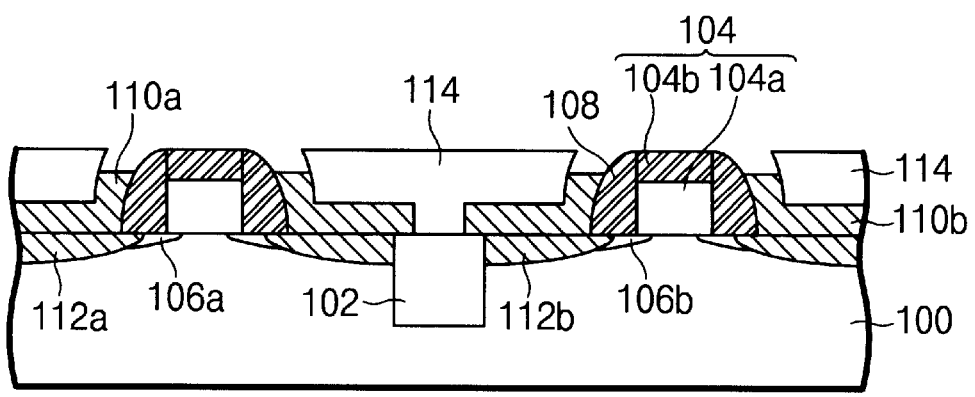
FIG. 6 is a cross-sectional view of an intermediate structure which when combined with the views of FIGS. 2–5 and 7, illustrates methods of forming field effect transistors according to a second embodiments of the present invention.
Figure 7:
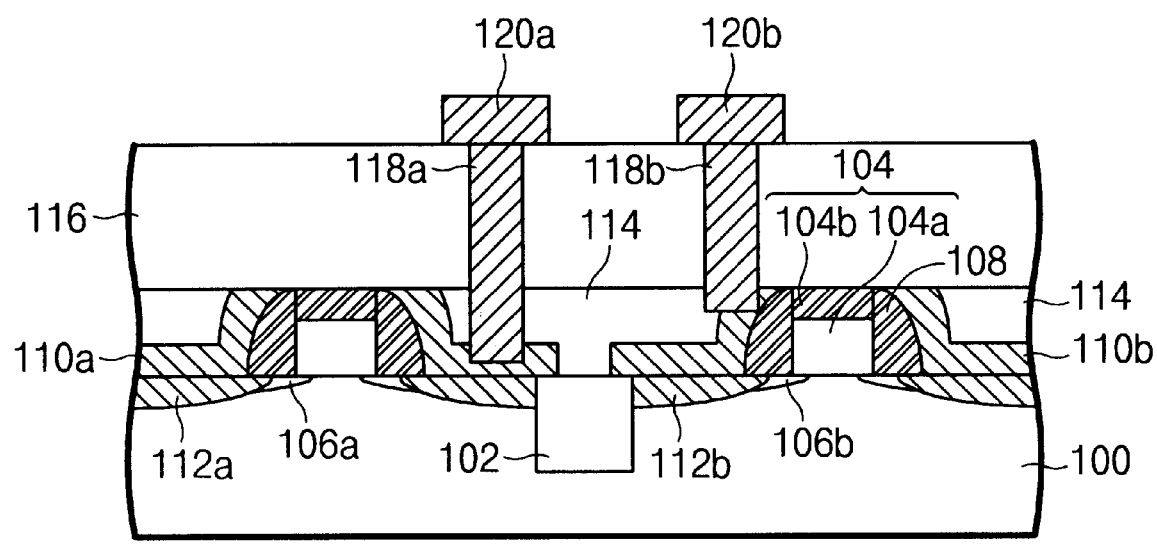

Referring now to FIG. 7, a second interlayer insulating layer 116 is then deposited on the structure of FIG. 5. Photolithographically defined etching steps are then performed to define contact holes in the first and second interlayer insulating layers 116 and 114. These etching steps are preferably performed using an etchant which has a high degree of selectivity in etching the material of the first and second interlayer insulating layers relative to the insulating cap 104b and sidewall spacers 108. Conductive plugs (e.g., doped polysilicon plugs, metal plugs) are then formed in the contact holes, as illustrated. A layer of metallization may then be formed on the second interlayer insulating layer 116 and patterned to define source and drain electrodes 120a and 120b. As illustrated by FIG. 6, an isotropic or anisotropic etching step may also be performed to etch the separate conductive regions 110a and 110b and thereby further inhibit the likelihood that these regions will remain electrically connected after the planarization step. However, reducing the lateral dimensions of the conductive region 110a and 110b may necessitate a greater degree of alignment precision when etching the second interlayer insulating layer to define the contact holes. The steps of FIG. 7 may then be performed on the structure of FIG. 6 to complete the formation of the preferred field effect transistors.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a field effect transistor, comprising the steps of:

forming an insulated gate electrode on a face of a substrate containing a semiconductor region therein extending to the face;

forming a conductive layer of first conductivity type on the face and on a sidewall and upper surface of the insulated gate electrode;

diffusing dopants of first conductivity type from the conductive layer into the semiconductor region to define source and drain regions of first conductivity type therein;

forming a first interlayer insulating layer on the conductive layer;

forming an intermediate source/drain contact by planarizing the first interlayer insulating layer and the conductive layer at least until the upper surface of the insulated gate electrode is exposed; then etching back the planarized conductive layer using the planarized first interlayer insulating layer as an etching mask; and forming an electrode electrically coupled to the intermediate source/drain contact.

2. The method of claim 1, wherein said step of forming a conductive layer comprises the steps of:

depositing a polycrystalline silicon layer on the face and on a sidewall and upper surface of the insulated gate electrode; and implanting dopants of first conductivity type into the deposited polycrystalline silicon layer.

3. The method of claim 2, wherein said step of forming an insulated gate electrode comprises the steps of:
   forming a gate oxide insulating layer on the face;
   forming a gate conductive layer on the gate oxide insulating layer, opposite the face;
   forming a gate capping layer on the gate conductive layer;
   patterning the gate capping layer, the gate conductive layer and the gate oxide layer to define a gate electrode having exposed sidewalls; and
   forming gate insulating spacers on the exposed sidewalls of the gate electrode.

4. The method of claim 3, wherein said step of forming gate insulating spacers is preceded by the step of implanting dopants of first conductivity type into the semiconductor region, using the gate electrode as an implant mask.

5. The method of claim 1, wherein said step of forming an insulated gate electrode comprises the steps of:
   forming a gate oxide insulating layer on the face;
   forming a gate conductive layer on the gate oxide insulating layer, opposite the face;
   forming a gate capping layer on the gate conductive layer;
   patterning the gate capping layer, the gate conductive layer and the gate oxide layer, to define a gate electrode having exposed sidewalls; and
   forming gate insulating spacers on the exposed sidewalls of the gate electrode.

6. The method of claim 5, wherein said step of forming gate insulating spacers is preceded by the step of implanting dopants of first conductivity type into the semiconductor region, using the gate electrode as an implant mask.

7. The method of claim 5, wherein the gate capping layer comprises silicon nitride; and wherein said step of forming gate insulating spacers comprises the step of depositing a layer of silicon nitride having a thickness in a range between about 500 and 1000 Å on an upper surface of the gate capping layer.

8. The method of claim 4, wherein said planarizing step comprises chemically-mechanically polishing the first interlayer insulating layer and the conductive layer.

9. The method of claim 1, further comprising the steps of:
   forming a second interlayer insulating layer on the planarized first interlayer insulating layer; and
   etching the second interlayer insulating layer to define a contact hole therein which exposes the intermediate source/drain contact.

10. The method of claim 3, further comprising the steps of:
    forming a second interlayer insulating layer on the planarized first interlayer insulating layer; and
    etching the second interlayer insulating layer to define a contact hole therein which exposes the intermediate source/drain contact.

11. A method of forming a field effect transistor, comprising the steps of:
    forming an insulated gate electrode on a face of a substrate containing a semiconductor region therein extending to the face;
    forming a conductive layer of first conductivity type on the face and on an upper surface and opposing sidewalls of the insulated gate electrode;
    diffusing dopants of first conductivity type from the conductive layer into the semiconductor region to define source and drain regions of first conductivity type therein;
    patterning the conductive layer to expose the face;
    planarizing the patterned conductive layer to define an intermediate source contact and an intermediate drain contact and expose the upper surface of the insulated gate electrode; then
    selectively etching the conductive layer using the upper surface of the insulated gate electrode as an etching mask; and then
    forming source and drain electrodes electrically coupled to the intermediate source and drain contacts, respectively.

12. The method of claim 11,
    wherein said planarizing step is preceded by the step of forming a first interlayer insulating layer on the patterned conductive layer;
    wherein said step of forming a conductive layer comprises the steps of:
       depositing a polycrystalline silicon layer on the face and on an upper surface and opposing sidewalls of the insulated gate electrode; and
       implanting dopants of first conductivity type into the deposited polycrystalline silicon layer; and
    wherein said planarizing step comprises planarizing the first interlayer insulating layer and the patterned conductive layer to expose the upper surface of the insulated gate electrode.

13. The method of claim 12, wherein said step of forming an insulated gate electrode comprises the steps of:
    forming a gate oxide insulating layer on the face;
    forming a gate conductive layer on the gate oxide insulating layer, opposite the face;
    forming a gate capping layer on the gate conductive layer;
    patterning the gate capping layer, the gate conductive layer and the gate oxide layer to define a gate electrode having exposed sidewalls; and
    forming gate insulating spacers on the exposed sidewalls of the gate electrode.

14. The method of claim 13, wherein said step of forming gate insulating spacers is preceded by the step of implanting dopants of first conductivity type into the semiconductor region, using the gate electrode as an implant mask.

15. The method of claim 14, wherein the gate capping layer comprises silicon nitride; and wherein said step of forming gate insulating spacers comprises the step of depositing a layer of silicon nitride having a thickness in a range between about 500 and 1000 Å on an upper surface of the gate capping layer.

16. The method of claim 15, wherein said planarizing step comprises chemically-mechanically polishing the first interlayer insulating layer and the conductive layer.

17. The method of claim 16, further comprising the steps of:
    forming a second interlayer insulating layer on the planarized first interlayer insulating layer; and
    etching the second interlayer insulating layer to define a contact hole therein which exposes the intermediate source/drain contact.

* * * * *